US008861215B2

(12) United States Patent
Nomoto et al.

(10) Patent No.: US 8,861,215 B2
(45) Date of Patent: Oct. 14, 2014

(54) SEMICONDUCTOR DEVICE

(75) Inventors: Miho Nomoto, Tokyo (JP); Yukitoshi Hirose, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 285 days.

(21) Appl. No.: 13/164,178

(22) Filed: Jun. 20, 2011

(65) Prior Publication Data

US 2011/0317372 A1  Dec. 29, 2011

(30) Foreign Application Priority Data

Jun. 24, 2010 (JP) .................... 2010-143800

(51) Int. Cl.
*H05K 7/00* (2006.01)
*G11C 5/04* (2006.01)
*G11C 5/06* (2006.01)
*H05K 1/14* (2006.01)
*H05K 1/18* (2006.01)

(52) U.S. Cl.
CPC *G11C 5/063* (2013.01); *G11C 5/04* (2013.01); *H01L 2924/15192* (2013.01)
USPC ........... 361/760; 361/736; 361/761; 361/764; 361/783

(58) Field of Classification Search
USPC ......... 361/728, 729, 733, 736, 737, 748, 760, 361/761, 764, 767, 772, 777, 781, 783, 361/784; 257/723, 773, 781, 784, 786; 370/360

See application file for complete search history.

(56) References Cited

U.S. PATENT DOCUMENTS 7,436,679 B2 * 10/2008 Iijima et al. .................... 361/760
2004/0196682 A1 * 10/2004 Funaba et al. ................. 365/149

FOREIGN PATENT DOCUMENTS

JP  2009-075682 A  4/2009

* cited by examiner

*Primary Examiner* — Hoa C Nguyen
*Assistant Examiner* — Binh Tran
(74) *Attorney, Agent, or Firm* — Sughrue Mion, PLLC

(57) ABSTRACT

A device includes: a wiring board having first and second surfaces opposing each other; and a plurality of memory packages on the first surface. The wiring board includes: a first set of terminals on the first surface; a plurality of second sets of terminals on the first surface; and a plurality of first signal lines. The terminals of the first set receive respective ones of a plurality of first signals supplied from a control device. Each of the second sets is provided for a corresponding one of the memory packages. The terminals of each of the second sets contact the corresponding one of the memory packages. The first signal lines extend from respective ones of the terminals of the first set while coupling respective ones of the terminals of each of the second sets. The first signal lines extend on the first surface without extending in the wiring board.

20 Claims, 26 Drawing Sheets

FIG. 7
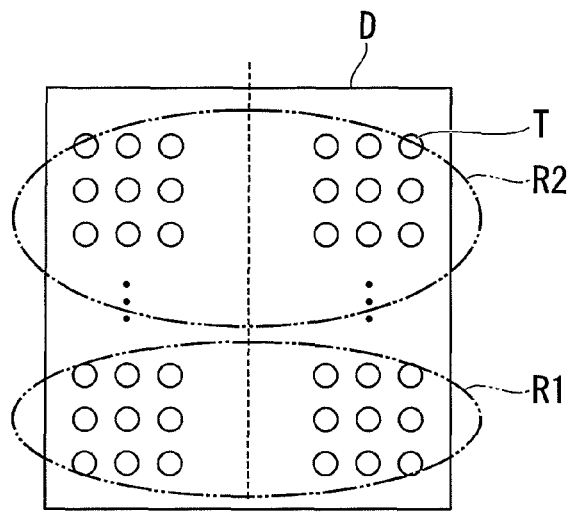
FIG. 8A
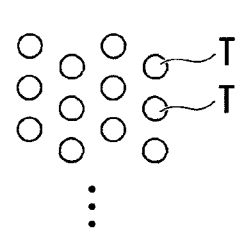
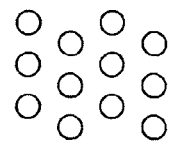
FIG. 8B
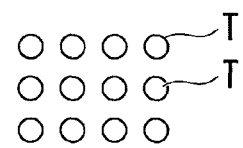
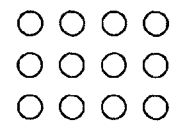

SEMICONDUCTOR DEVICE

BACKGROUND OF THE INVENTION

1. Field of the Invention

The present invention relates to a BGA (Ball Grid Array) semiconductor device.

Priority is claimed on Japanese Patent Application No. 2010-143800, filed Jun. 24, 2010, the content of which is incorporated herein by reference.

2. Description of the Related Art

When designing a system using a high-speed semiconductor device, such as when connecting a memory controller to multiple semiconductor memory devices, a fly-by topology is generally used in order to ensure the quality of waveforms. Regarding the fly-by topology, a command signal, an address signal, and a clock signal are supplied through one wire to each of the semiconductor memory devices.

Japanese Patent Laid-Open Publication No. 2009-75682 discloses a memory interface using the fly-by topology for connecting a memory controller and memory modules (DIMM). Specifically, regarding a clock signal CK, an address signal Add, and a command signal CMD, a memory controller 90 is connected by daisy chain to multiple SDRAM 92-1 to 92-n included in a DIMM module 91. Regarding a data signal DQ and a data strobe signal DQS, the memory controller 90 is connected by multiple wires to the respective SDRAM 92-1 to 92-n.

FIG. 26 illustrates a state in which multiple memory devices of a semiconductor device D are connected by daisy chain, i.e., in series to a memory controller C. In the case of the fly-by topology shown in FIG. 26, each memory device D includes multiple terminals on a surface thereof, and a terminal of one memory device D has to be connected by a signal wire to a corresponding terminal of an adjacent memory device D so that the memory devices D are connected in series. Thus, multiple signal wires are necessary.

However, when applying the fly-by topology shown in FIG. 26 to multiple command signals and address signals, the signal wires cross over one another on the same surface of a substrate, as shown in FIG. 27. FIG. 27 illustrates arrangement of terminals and connection of wires to the terminals on a surface of the semiconductor memory device D.

As shown in FIG. 27, multiple terminals T, T', and T" are provided on a rear surface of the semiconductor device D. Wires F are provided on an upper surface side of the semiconductor device D. The wires F extend in the right and left direction. The wires F are connected to the respective terminals T. Wires W0 extend only in the right direction. The wires W0 are connected to the respective terminals T'.

Although only one semiconductor device D is shown in FIG. 27, another semiconductor device D is positioned adjacent to the illustrated semiconductor device D. The wires F extend in the horizontal direction of FIG. 27 and are connected to terminals on the right and/or left adjacent semiconductor devices D. In other words, the fly-by wires F, which are connected to the respective terminals (balls) T positioned on the right side of the surface of the semiconductor device D, are connected to corresponding terminals (balls) on the adjacent semiconductor device D, to a memory controller C, or to a termination resistor Rt shown in FIG. 26.

Although not shown, the wires W0, which are connected to the terminals (balls) T' positioned on the left side of the surface of the semiconductor device D, are connected to terminals on a right adjacent semiconductor device D. However, the wires W0 cannot extend in the right direction of FIG. 27 as indicated by a dashed line X, though the wires W0 extend straight in the left direction. For this reason, the wires W0 cross over the fly-by wires F on the substrate surface.

Currently, the limited number of wires can be provided between the terminals T" on the left side and the terminal T" on the right side, which are not positioned in the same horizontal line (not shown). For this reason, fly-by connection of the left and right terminals T" cannot be achieved using only wires provided on the upper surface of the semiconductor device mounting board. To enable the fly-by topology, main wires have to be provided on an internal layer of a multi-layered substrate B, and vias V have to be provided close to signal terminals on the rear surface of each semiconductor device, as shown in FIGS. 28 to 30.

FIG. 28 is a plan view illustrating a fly-by topology in which fly-by wires on an upper surface of a multi-layered substrate are connected to main wires on an internal layer or on a rear surface of the multi-layered substrate. FIG. 29 is a cross-sectional view illustrating the wires on the internal layer of the multi-layered substrate shown in FIG. 28. FIG. 30 is a plan view illustrating an upper surface of a module including wires connected as shown in FIGS. 28 and 29.

As shown in FIGS. 28 to 30, fly-by wires are provided on an inner layer of a multi-layered substrate B so as to be connected to terminals through vias V near the terminals. In this case, a wire F01 on a surface layer, which extends from the terminal T of the semiconductor device D (D00, D01, and the like) to a via V, is a stub wire S.

The stub (branching) portions of the wire F01 are shown in FIG. 28. The stub (branching) portions of the via V are shown in FIG. 29. The length of the wire F01 on the surface layer, which is part of the stub wire, can be maximally shortened in a system including a multi-layered substrate.

A system requiring lower costs, such as digital consumer electronics, uses a four-layered substrate. For the four-layered substrate, however, it is difficult to shorten the length of the wire F01 between the terminal to the via V, which is part of a stub wire.

Regarding the four-layered substrate, it is general to provide ground planes in the second and third layers in consideration of signal integrity that indicates how properly a signal waveform of a digital signal is transmitted. For this reason, fry-by wires cannot be provided on the second and third layers, and therefore all fly-by wires have to be provided on a rear surface of the substrate, which is the side on which no semiconductor substrate is mounted. In this case, adjacent wires have to be distanced from each other by a value greater than defined by the design rule of the substrate, in consideration of crosstalk noises. Accordingly, the length of the stub wire (i.e., the stub length) between a via and a terminal of the semiconductor device including the four-layered substrate becomes larger than that of a semiconductor device including a substrate with the greater number of layers in which fly-by wires can be provided on the second and third layers.

As the stub length increases, the signal integrity further degrades due to the effect of reflective noises. Particularly when the data rate of the transmission signal is set to be greater, the signal integrity further degrades due to reflection.

SUMMARY

In one embodiment, a device includes, but is not limited to: a wiring board having a first surface and a second surface opposing the first surface; and a plurality of memory packages on the first surface. The wiring board includes, but is not limited to: a first set of terminals on the first surface; a plurality of second sets of terminals on the first surface; and a plurality of first signal lines. The terminals of the first set receive respective ones of a plurality of first signals supplied from a control device. Each of the second sets is provided for a corresponding one of the plurality of memory packages. The terminals of each of the second sets contact the corresponding one of the plurality of memory packages. The plurality of first signal lines extend from respective ones of the terminals of the first set while coupling respective ones of the terminals of each of the second sets. The plurality of first signal lines extend on the first surface without extending in the wiring board.

In another embodiment, a semiconductor device may include, but is not limited to: a wiring board; first and second semiconductor packages; first to third sets of terminals; and a plurality of signal paths. The wiring board has a first surface. The first semiconductor package has a second surface facing the first surface. The second semiconductor package has a third surface facing the first surface. The first set of terminals are positioned on the first surface. The terminals of the first set receive respective ones of a plurality of first signals supplied from a control device. The second set of terminals are positioned on the second surface. The second set of terminals contact the first surface. The third set of terminals are positioned on the third surface. The third set of terminals contact the first surface. The plurality of signal paths extend from respective ones of the terminals of the first set while coupling respective ones of the terminals of the second set and respective ones of the terminals of the third set. Each of the plurality of signal paths is free of branching portions.

In another embodiment, a semiconductor device may include, but is not limited to: a wiring board; a semiconductor package; first and second pairs of terminals; and first and second signal paths. The wiring board has a first surface. The semiconductor package has a second surface facing the first surface. The first and second pairs of terminals are positioned on the second surface. The first and second pairs of terminals contact the first surface. The first signal path has a first portion coupling the first pair of terminals. The second signal path has a second portion coupling the second pair of terminals. Each of the first and second signal paths is free of branching portions.

BRIEF DESCRIPTION OF THE DRAWINGS

The above features and advantages of the present invention will be more apparent from the following description of certain preferred embodiments taken in conjunction with the accompanying drawings, in which:

FIG. 7 is a plan view illustrating arrangement of terminals on a rear surface of a semiconductor package according to a second embodiment of the present invention;

FIGS. 8A and 8B are plan views illustrating examples of arrangement of terminals on the rear surface of the semiconductor package of the second embodiment;

DETAILED DESCRIPTION OF THE PREFERRED EMBODIMENTS

The present invention will now be described herein with reference to illustrative embodiments. The accompanying drawings explain semiconductor devices in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
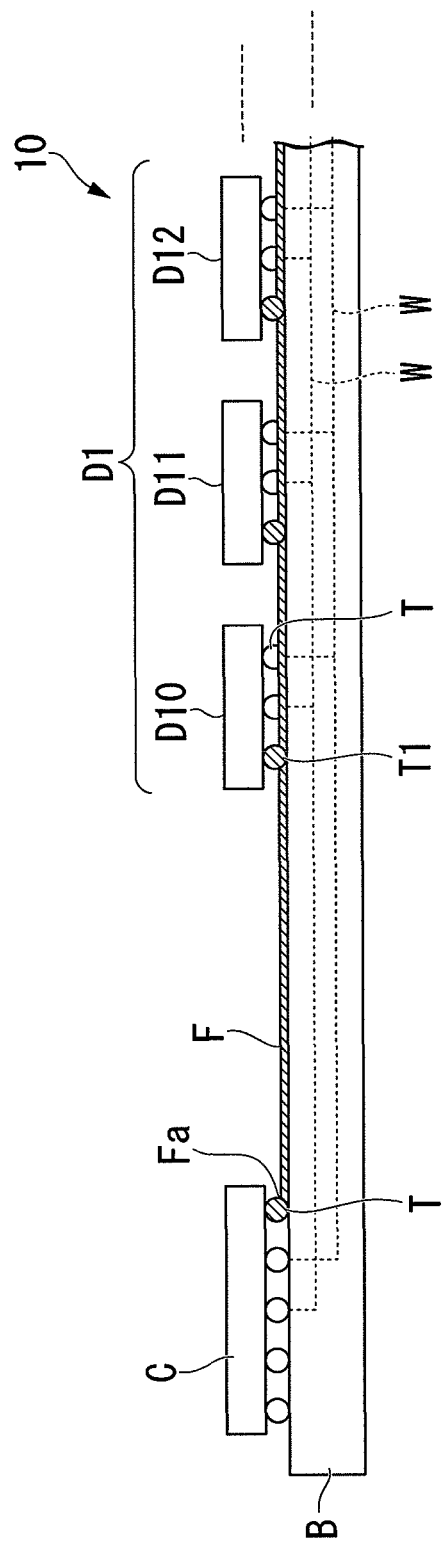
FIG. 1 is a cross-sectional view illustrating a semiconductor device of a first embodiment of the present invention.
Figure 2:
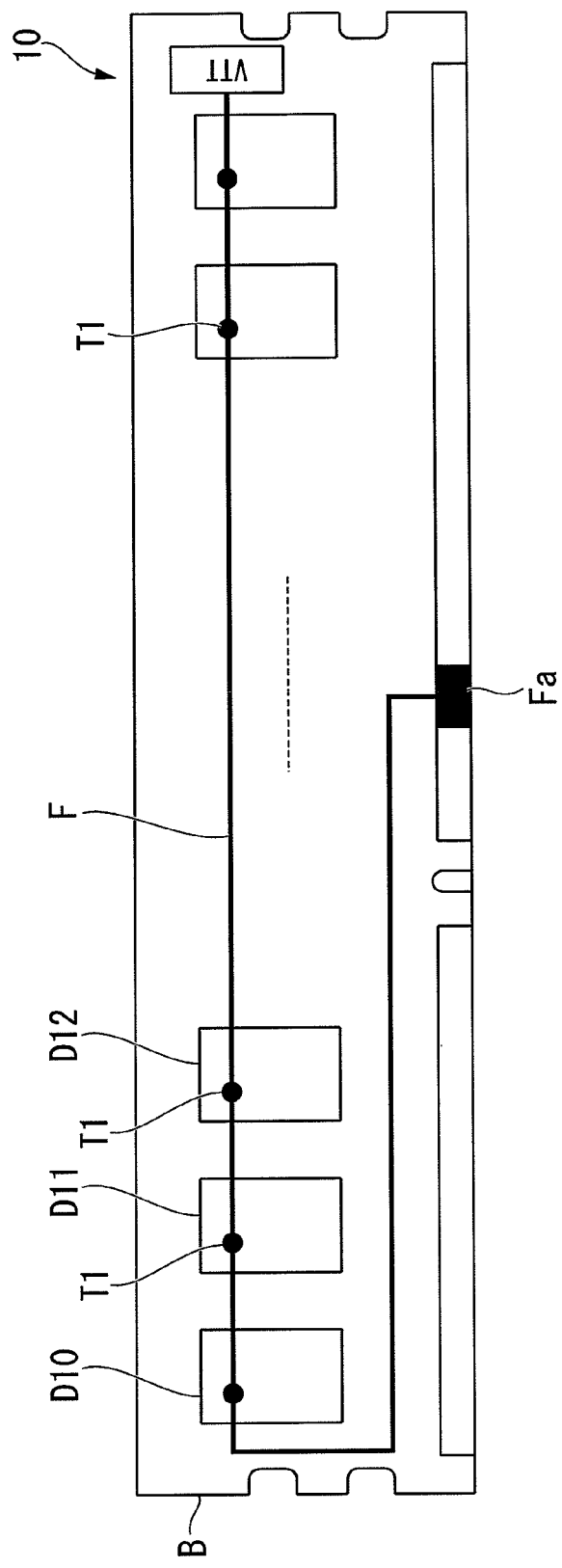
FIG. 2 is a plan view illustrating a module that is an example of the semiconductor device of the first embodiment.
Figure 3:
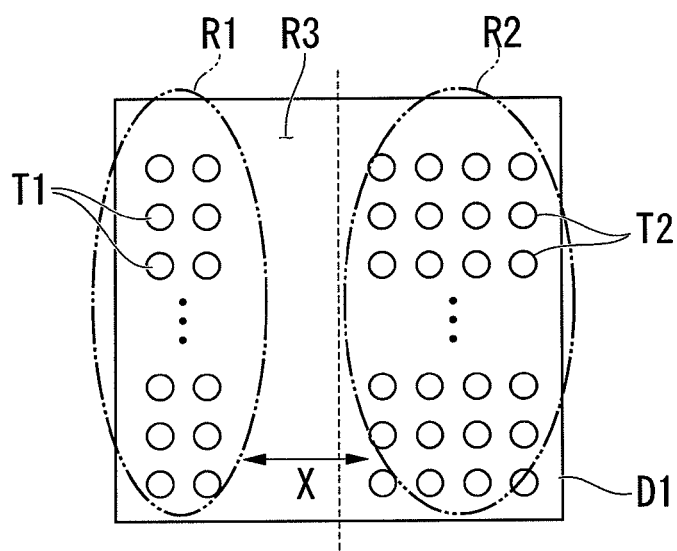
FIG. 3 is a plan view illustrating arrangement of terminals on a rear surface of a semiconductor package of the first embodiment.

Hereinafter, a semiconductor device 10 according to a first embodiment of the present invention is explained. FIG. 1 is a cross-sectional view illustrating the semiconductor device 10 of the first embodiment. FIG. 2 is a plan view illustrating connection of semiconductor packages by fly-by wires on an upper surface of a module that is an example of the semiconductor device 10. FIG. 3 is a plan view illustrating an arrangement of terminals on a rear surface of the semiconductor package.

As shown in FIGS. 1 to 3, the semiconductor device 10 includes a wiring board B and multiple semiconductor packages D1 on the wiring board B. The wiring board B is made of an insulating board. The wiring board B has a multi-layered structure. Multiple wires (signal lines, signal paths) F are formed on an upper surface of the wiring board B, as shown in FIG. 2. Other wires W are formed in internal layers of the wiring board B, as shown in FIG. 1.

The semiconductor packages D1 includes a memory D10, a memory D11, a memory D12, and the like. One end (first input terminal) Fa of the wire F is connected to a memory controller C, as shown in FIG. 1. When the wiring board B is used as a module, the semiconductor packages D1 are connected by the wire F, the input terminal Fa of which is provided on an edge of the wiring board B, as shown in FIG. 2.

The wire (signal path) F is a fly-by wire for transferring a signal including at least one of a clock signal, an address signal, and a command signal. The wire F connects terminals (metal balls) T on the rear surfaces of the semiconductor packages D, as shown in FIG. 3. The terminals (balls) T are arranged by a BGA method. The terminals (balls) T are arranged at a pitch of 0.8 mm or the like.

As shown in FIG. 3, the balls T on the rear surface of each of the memories D10, D11, and the like include at least balls T1 and T2. The balls T1 are connected to the fly-by wires F shown in FIGS. 1 and 2. The balls T2 are connected to other wires W through vial holes V. The balls T may include, other than the balls T1 and T2, support balls for fixing the semiconductor packages D1 onto the wiring board B.

As shown in FIG. 3, the rear surface of the semiconductor package D1 has a fly-by region R1, another signal region R2 which is distanced from the fly-by region R1 by a distance X, and a wiring connection region R3 between the fly-by region R1 and the other signal region R2. The balls T1 are arranged in the fly-by region R1. The balls T2 are arranged in the other signal region R2. No ball is arranged in the wiring connection region (third region) R3.

Figure 4:
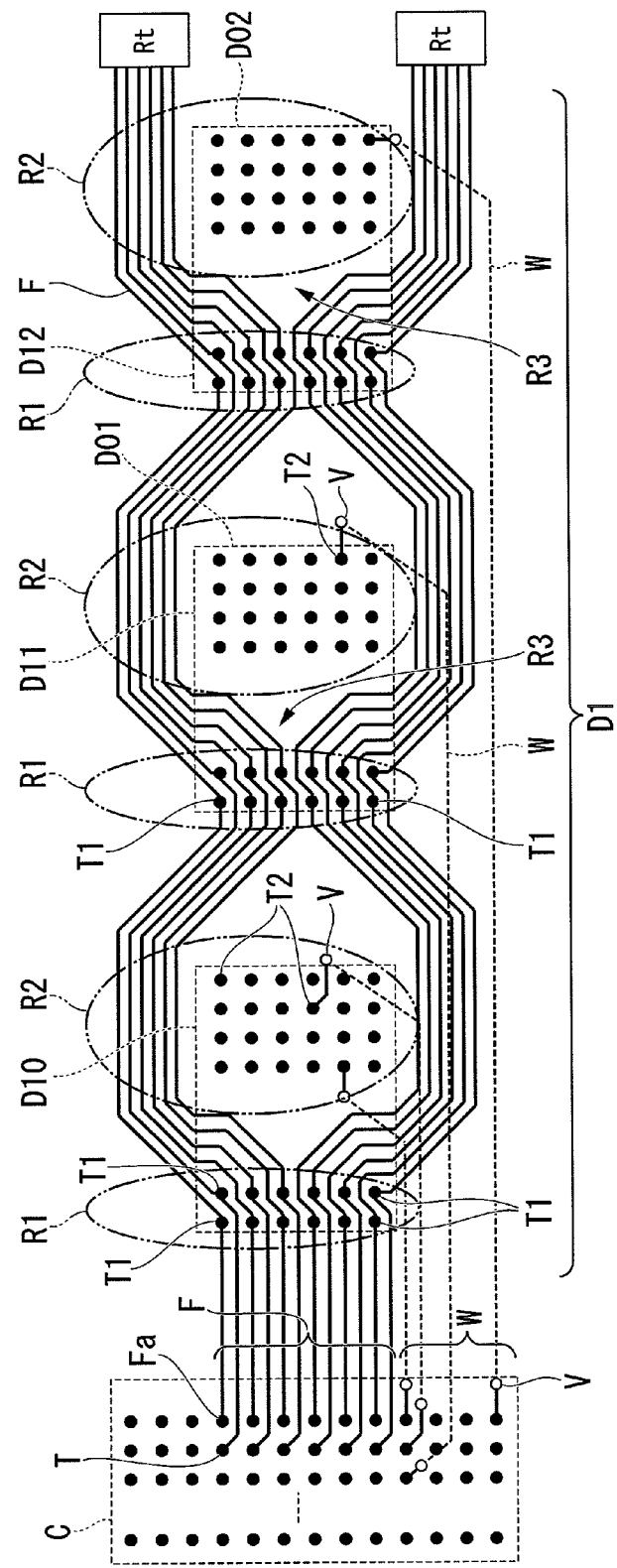
FIG. 4 is a plan view illustrating a signal path structure of the semiconductor device of the first embodiment.

FIG. 4 is a plan view illustrating a wiring structure on the upper surface of the semiconductor device 10 and arrangement and connection of the terminals (balls) on the rear surface of the semiconductor device 10. In the case of FIG. 4, the memory controller C and the memories D10, D11, and D12 are arranged in a line on the supper surface of the wiring board B. The fly-by wires F extend from the input terminals Fa of the memory controller C to the termination resistor Rt on the upper surface of the wiring board B.

The memories D10, D11, and D12 are arranged in a line such that the arrangement direction of the fly-by region R1 and the other signal region R2 of each memory is equal to the arrangement direction of the memories D10, D11, and D12 in plan view. The arrangement of balls T1 on each memory is substantially the same among the memories D10, D11, and D12, and is independent from the total number of balls.

The one end Fa of the fly-by wire F is connected to a terminal T on the memory controller C. The fly-by wire F extends in the horizontal direction and is connected to a fly-by terminal T1 of the memory D10. The fly-by wire F extends over the wiring connection region R3, avoids the balls T2 in the other signal region R2 of the memory D10, and is connected to a ball T1 in the fly-by region R1 of the adjacent memory D11. Then, the fly-by wire F extends over the wire connection region R3 of the memory D11, avoids the balls T2 in the other signal region R2 of the memory D11, and is connected to a ball T1 in the fly-by region R1 of the adjacent memory D12. Then, the fly-by wire F extends over the wiring connection region R3 of the memory D12, avoids the balls T2 in the other signal region R2 of the memory D12, and is connected to the termination resistor Rt. Additionally, each of the fly-by wires F has no branching portion that becomes a stub that generates reflective noises causing degradation of signal waveforms.

Figure 24A:
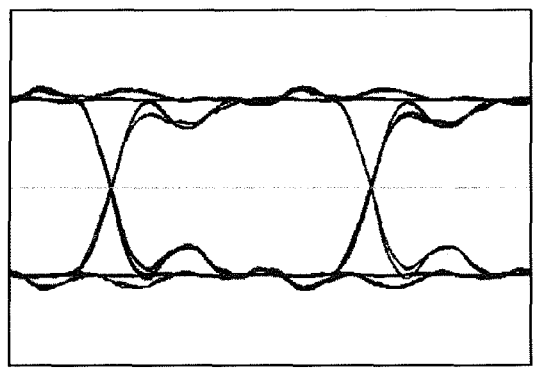
FIGS. 24A to 24C are graphs illustrating the relationship between the stub length and a signal waveform.
Figure 24B:
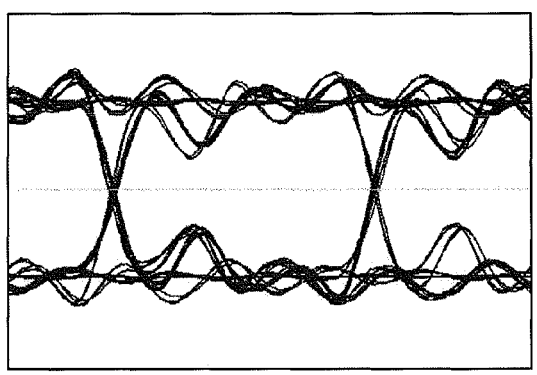
Figure 24C:
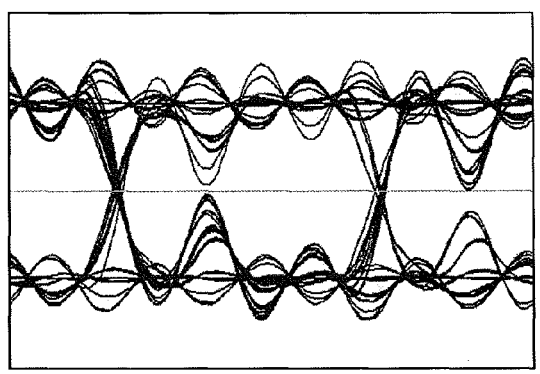

FIG. 24A illustrates simulation waveforms of signals when there is no stub as in the case of FIG. 4. FIGS. 24B and 24C illustrate simulation waveforms of signals when there are stubs. FIG. 24C illustrates the case in which the stub length is longer than in the case of FIG. 24B. As understood from FIGS. 24A to 24C, as the stub length increases, the signal integrity degrades due to reflective noises. Thus, it can be understood that the signal integrity of the topology of the first embodiment, in which there is no stub, is best.

Figure 25A:
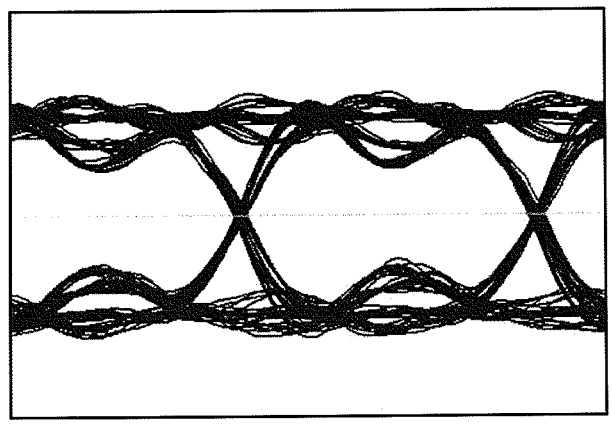
FIGS. 25A and 25B are graphs illustrating the relationship between the stub length and a signal waveform in case of a high data rate.
Figure 25B:
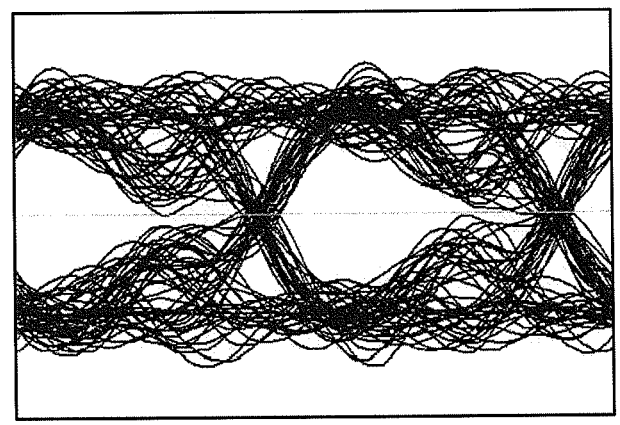
Figure 26:
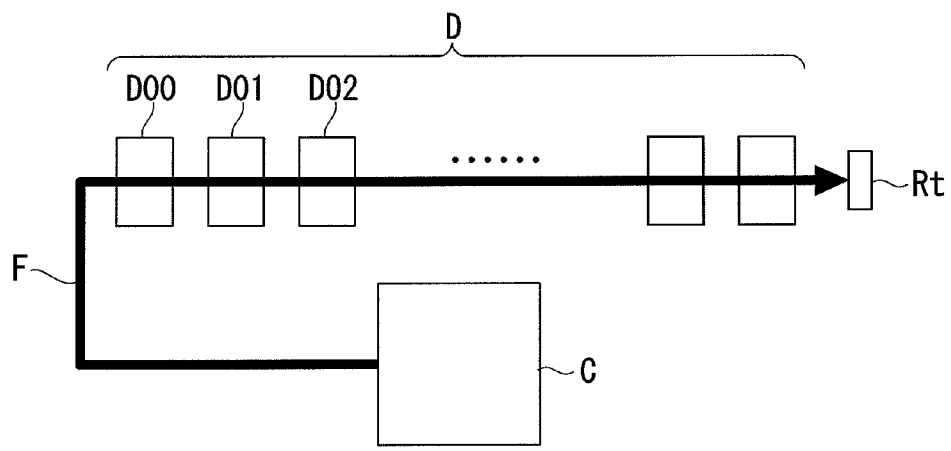
FIG. 26 illustrates a semiconductor device according to related art.
Figure 27:
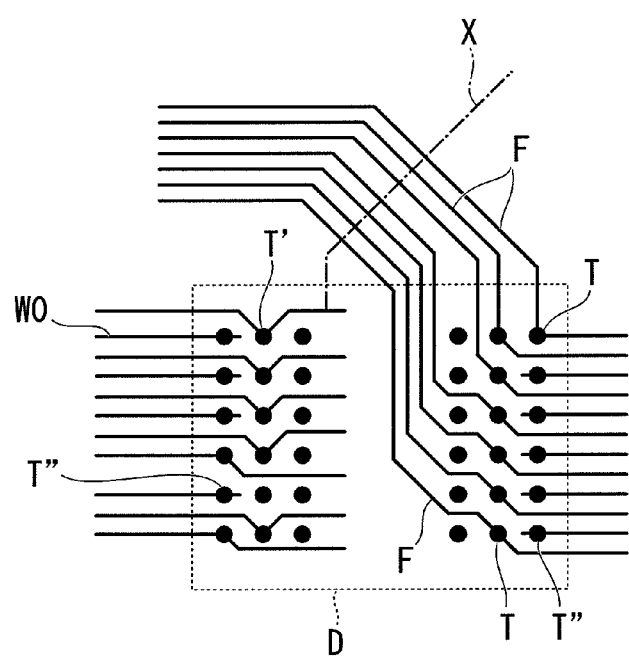
FIGS. 27 and 28 are plan views illustrating a signal path structure of the semiconductor device of the related art.
Figure 28:
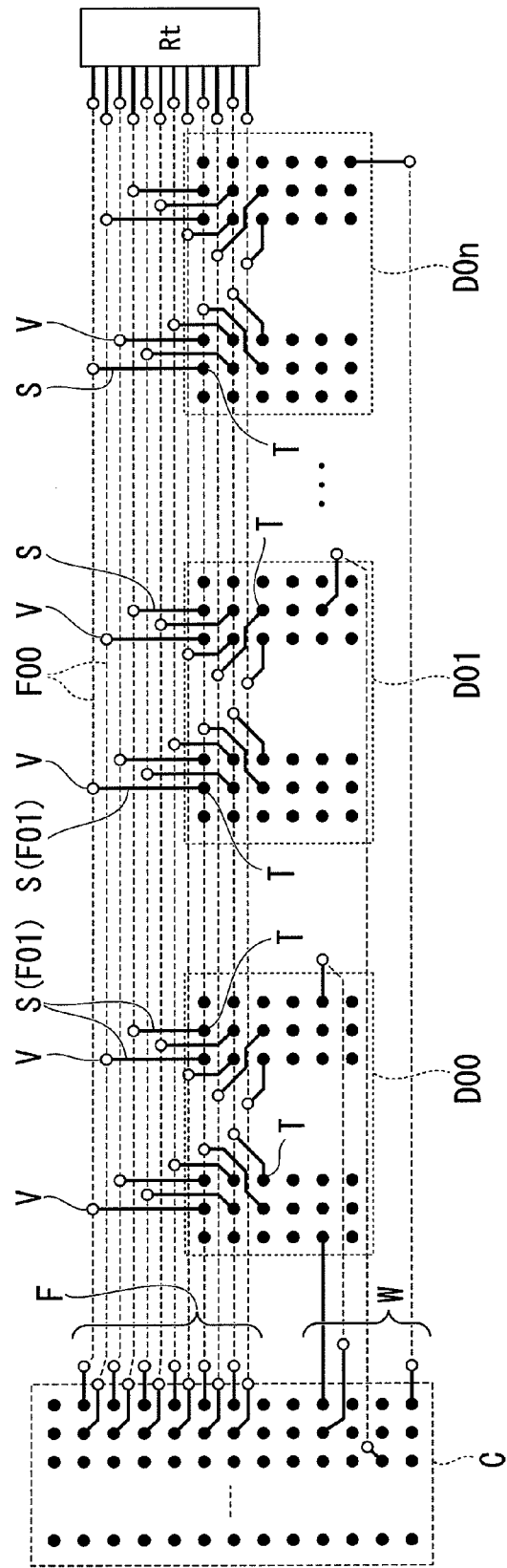
Figure 29:
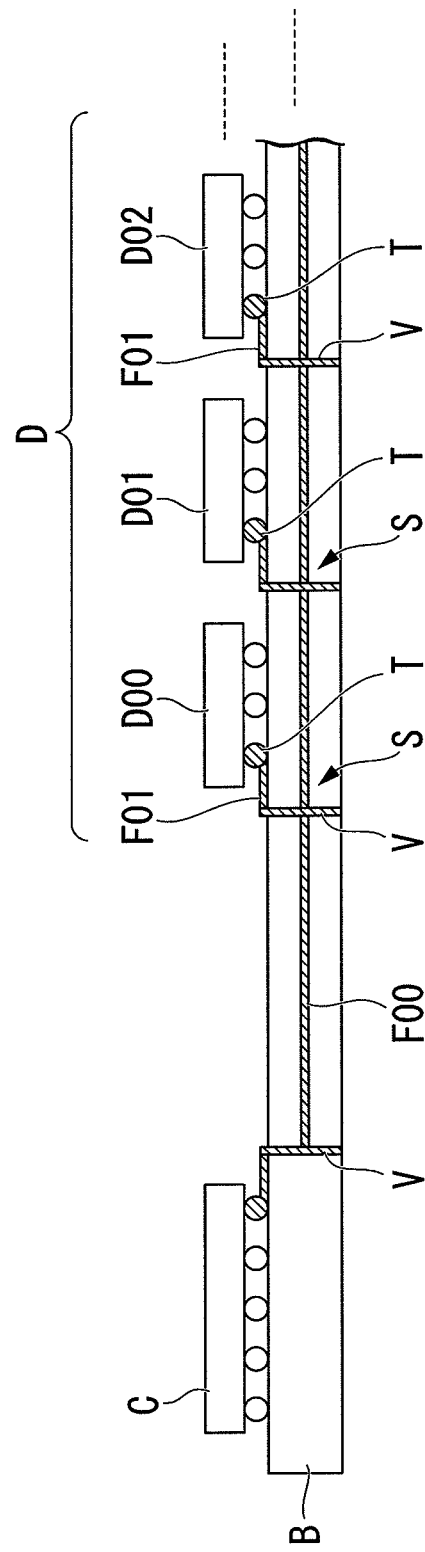
FIG. 29 is a cross-sectional view illustrating the signal path structure of the semiconductor device of the related art.
Figure 30:
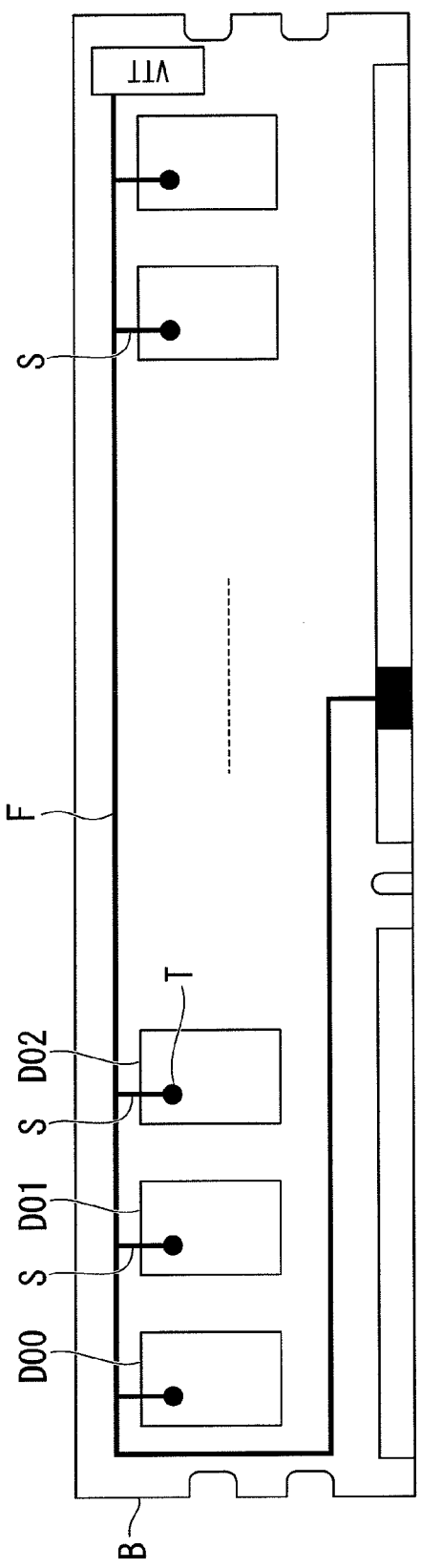
FIG. 30 is a plan view illustrating a module that is an example of the semiconductor device of the related art.

FIGS. 25A and 25B illustrate a case in which the data rate of signals is higher than in the case of FIGS. 24A to 24C. FIG. 25A illustrates the signal integrity in the case in which there is no stub, and corresponds to FIG. 24A. FIG. 25B illustrates the signal integrity in the case in which there are stubs, and corresponds to FIG. 24B.

As understood from FIGS. 24A to 24C, and 25A and 25B, even when the multi-layered substrate is used to set the stub length to be as small as possible, as the data rate increases, the signal integrity degrades due to the reflective noises.

With the higher operation rate in the future, the demand for "stubless" wires in the fly-by topology is expected to increase. The "stubless" means that the stub length is set to be zero or as small a value as possible.

According to the first embodiment, the fly-by wiring structure including no via and stub wire can be achieved such that all the balls T1 on the respective semiconductor packages D1 are connected by non-branching fly-by wires. Accordingly, the semiconductor packages 1 are connected to one another by the "stubless" fly-by topology, thereby preventing degradation of signal integrity of semiconductor devices requiring the high operation rate.

Second Embodiment

In the first embodiment, for each semiconductor package D1, the pitch of the balls T1 in the fly-by region R1 is set to be equal to the pitch of the balls T2 in the other signal region R2. The width X of the wiring connection region R3 (i.e., the distance between the regions R1 and R2) is set to be larger than the pitches of the balls in the regions R1 and R2. Thus, the fly-by wires F can be provided on the same upper layer of the wiring board B on which the semiconductor packages D1 are arranged.

Figure 5:
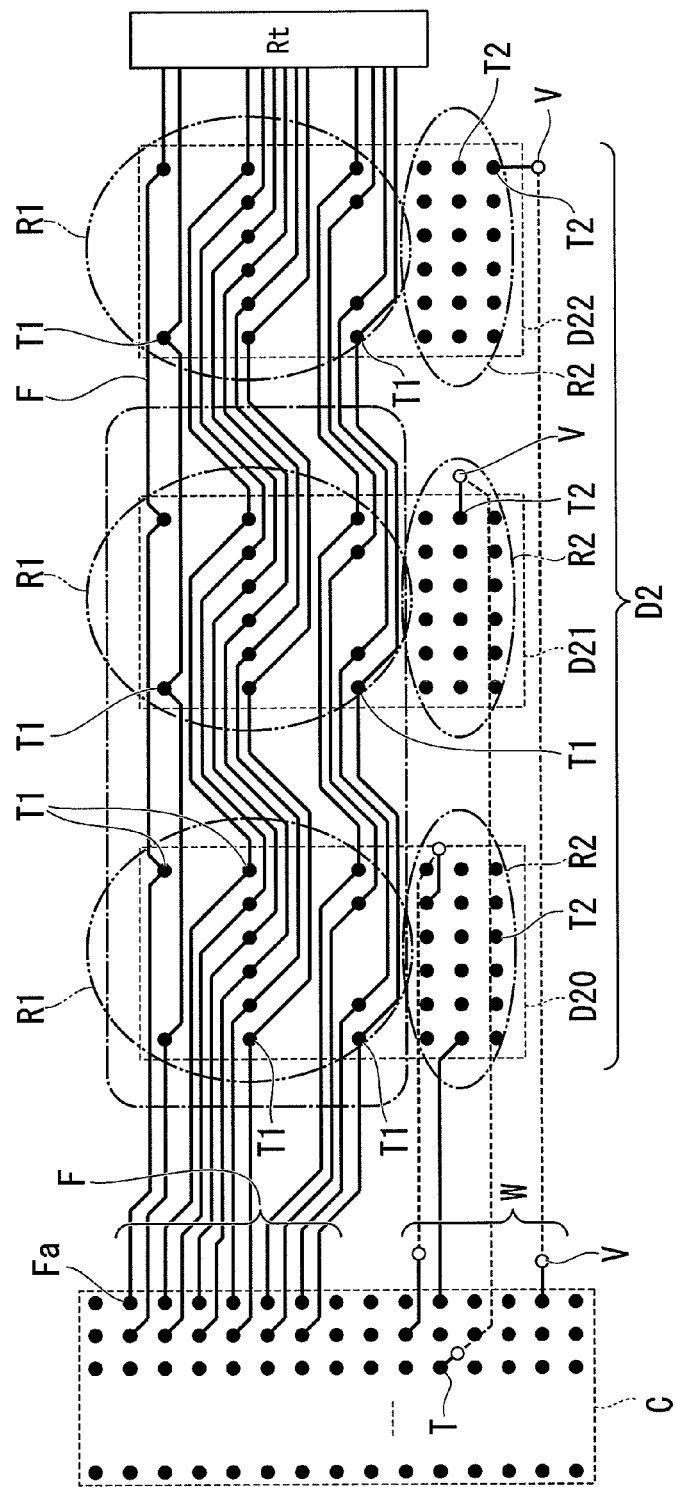
FIG. 5 is a plan view illustrating a signal path structure of a second embodiment of the present invention.
Figure 6:
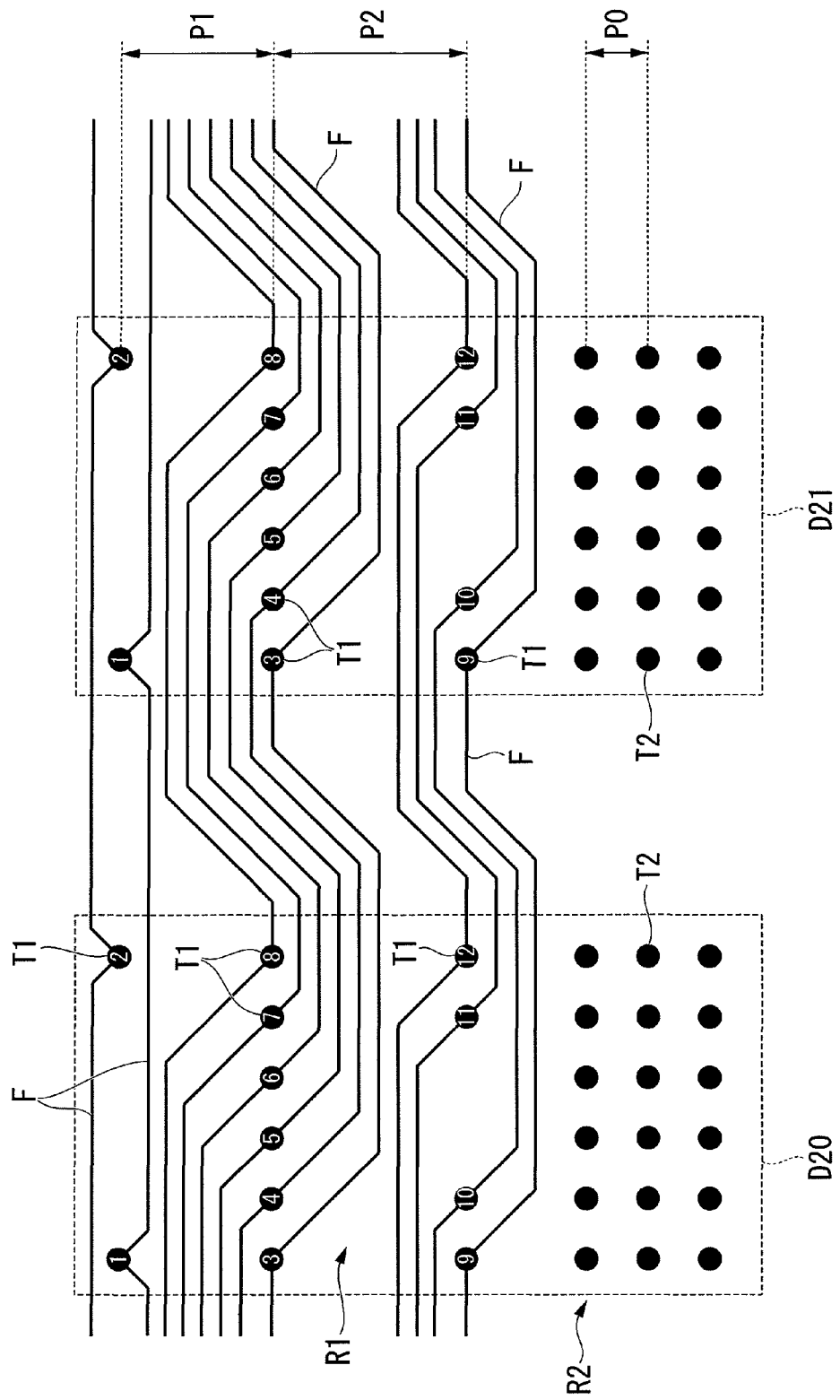
FIG. 6 is an enlarged plan view illustrating the signal path structure shown in FIG. 5.

In a second embodiment of the present invention, the other signal region R2 is arranged adjacent to the fly-by region R1 without providing the wiring connection region R2, as shown in FIGS. 5 and 6. Further, the pitch of the ball T1 in the fly-by region R1 is increased.

FIG. 5 is a plan view illustrating a wiring structure on an upper surface and arrangement and connection of terminals on a rear surface of a semiconductor package of the second embodiment. FIG. 6 is a plan view illustrating arrangement of terminals on the rear surface of the semiconductor package of the second embodiment. Like reference numerals denote like elements between the first and second embodiments.

As shown in FIGS. 5 and 6, semiconductor packages D20, D21, and D22 are arranged in a horizontal line, similar to in the first embodiment. In each of the semiconductor packages D20, D21, and D22, the fly-by region R1 and the other signal region R2 are arranged in a direction (vertical direction) perpendicular to the arrangement direction (horizontal direction) of the semiconductor packages. Specifically, the fly-by region R1 and the other signal region R2 are positioned in the upper and lower parts of the rear surface of each semiconductor package, respectively.

As shown in FIG. 6, in the fly-by region R1 of each of the semiconductor packages D20, D21, and D22, the first line of the balls T1 is distanced from the second line of the balls T1 by a pitch P1 in the vertical direction. The second line of balls T1 is distanced from the third line of the balls T1 by a pitch P2 in the vertical direction. In the other signal region R2, the balls T2 are arranged in the vertical direction at a pitch P0. The pitch P1 and P2 in the fly-by region R1 is greater than the pitch P0 in the other signal region R2. Fly-by wires F extend in the horizontal direction.

The number of wires required for connecting the balls arranged at the pitch P1 can be obtained by subtracting two from the sum of the number of balls aligned in the first and second lines. Similarly, the number of wires required for connecting the balls arranged at the pitch P2 can be obtained by subtracting two from the sum of the number of balls aligned in the second and third lines. The pitches P1 and P2 may be set to values such that the above calculated number of wires can be provided. In other words, the pitch between two lines can be set to a value that is obtained by subtracting two from the sum of the smallest ball number of the ball on the upper line and the largest ball number of the ball on the lower line.

According to the second embodiment, the stubless fly-by topology can be achieved, which cannot be achieved by the structure of the related art shown in FIG. 7 in which all the balls are arranged at the same pitch without providing space between the fly-by region R1 and the other signal region R2.

In the first and second embodiments, the balls T are arranged in the horizontal and vertical directions at the same pitch first, as shown in FIG. 8B. Then, the wiring connection region R3 is formed, or the pitches P1 and P2 are increased. However, the balls T may be arranged such that every other raw or column of balls is shifted by the half pitch, as shown in FIG. 8A. In the case of FIG. 8A, a routing of the fly-by wires F can be carried out more efficiently.

As explained above, according to the first and second embodiments, arrangement of balls and connection of wires to the balls are specified, thereby achieving the stubless fly-by wiring structure. The stubless fly-by wiring structure can also be achieved by modifying the package structure.

Third Embodiment

Hereinafter, a third embodiment of the present invention is explained. Like reference numerals denote like elements among the first to third embodiments, and explanations thereof are omitted hereinafter.

In the third embodiment, a stubless wiring structure is achieved even though the fly-by wire F is divided into multiple portions F01, F02, and the like on the upper surface of the wiring board B, as shown in FIGS. 9 to 18. Such a stubless wiring structure is explained in detail hereinafter.

Figure 16:
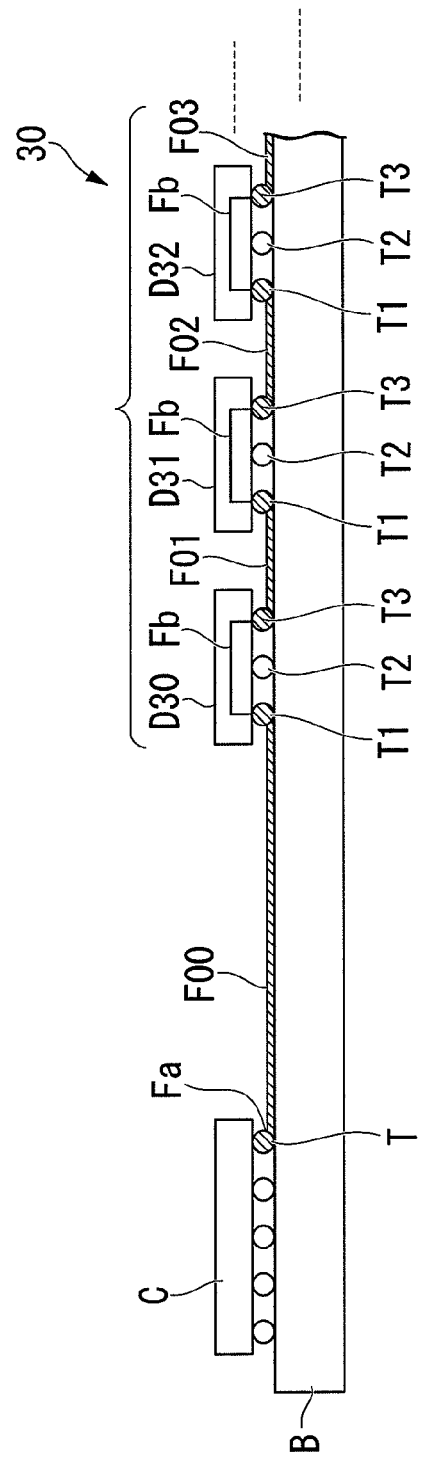
FIG. 16 is a cross-sectional view illustrating a signal path structure of the semiconductor device of the third embodiment.

FIG. 16 is a cross-sectional view illustrating a semiconductor device 30 of the third embodiment. A fly-by wire F00 connects the ball T at the input terminal Fa on the memory controller C to the ball T1 on a semiconductor package D30. A fly-by wire F01 connects the ball T3 on the semiconductor package D30 to the ball T1 on a semiconductor package D31. A fly-by wire F03 connects the ball T3 on the semiconductor package D31 to the ball T1 on a semiconductor package D32. Thus, one non-branching wire connection is enabled.

Figure 17:
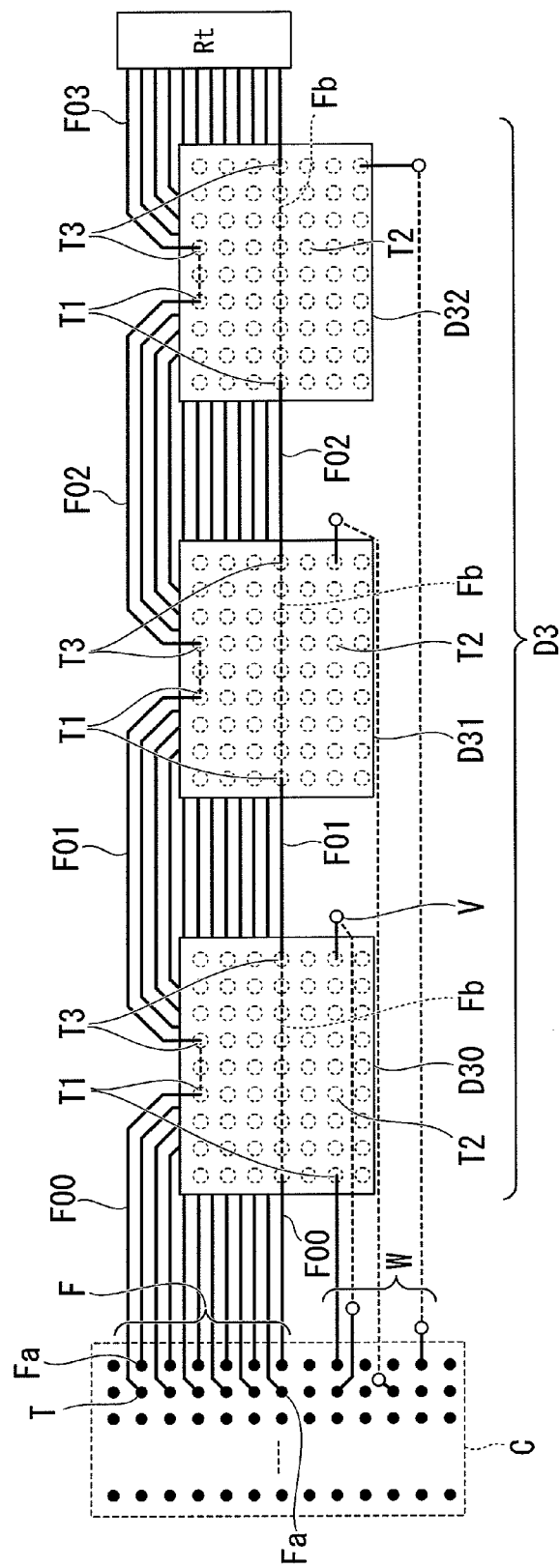
FIG. 17 is a plan view illustrating a signal path structure on a rear surface side of the semiconductor device of the third embodiment.
Figure 18:
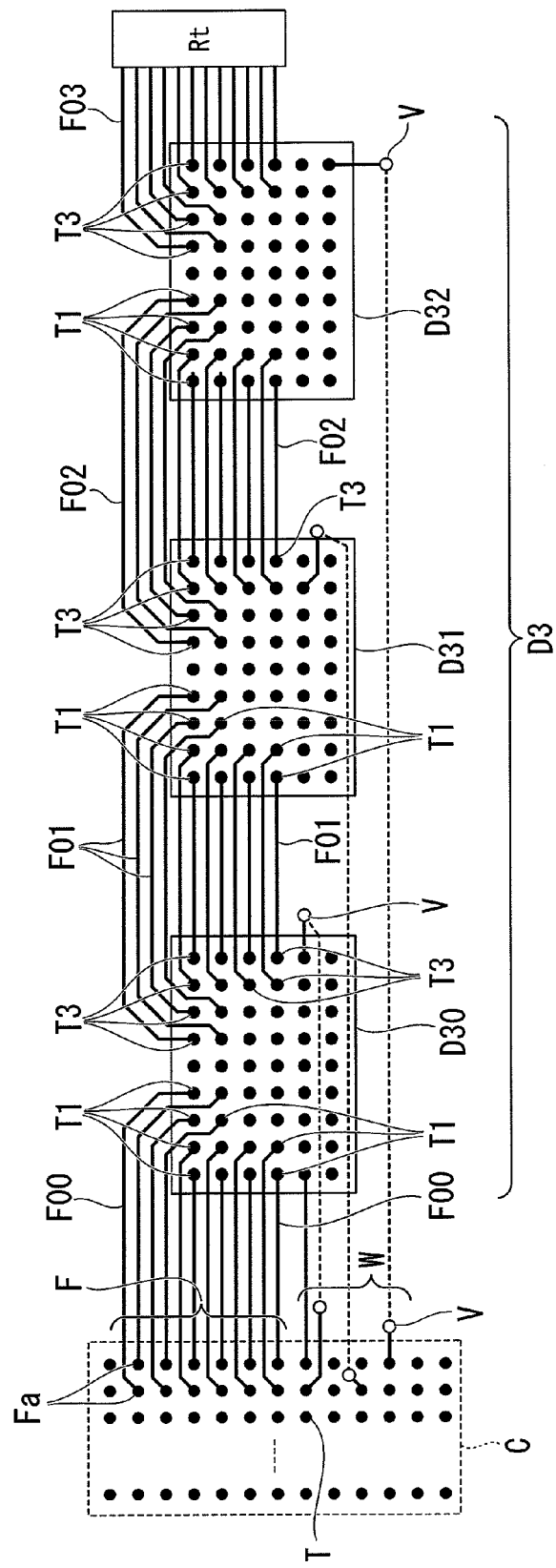
FIG. 18 is a plan view illustrating the signal path structure on an upper surface side of the semiconductor device shown in FIG. 17.

FIG. 17 is a plan view illustrating a wiring structure of the semiconductor device 30, arrangement of balls on a rear surface of the semiconductor package, and connection of balls by conductive paths Fb in the semiconductor package. FIG. 18 is a plan view illustrating a wiring structure on the upper surface of the wiring board B, and arrangement of balls on the rear surface of the semiconductor package.

Semiconductor packages D3 of the third embodiment include semiconductor packages D30, D31, D32, and the like. A conductive path Fb is included in each of the memories (semiconductor packages) D30, D31, and D32, as shown in FIGS. 16 to 18. FIG. 18 illustrates wires on the upper surface of the wiring board B which are shown in FIGS. 16 and 17. The conductive path Fb connects the balls T1 and T3 on the rear surface of each semiconductor package. Thus, the balls T1 and T3 are paired for each of the semiconductor packages D30, D31, and D32. The number of pairs of the balls T1 and T3 is equal to the number of fly-by wires F to be provided.

Figure 9:
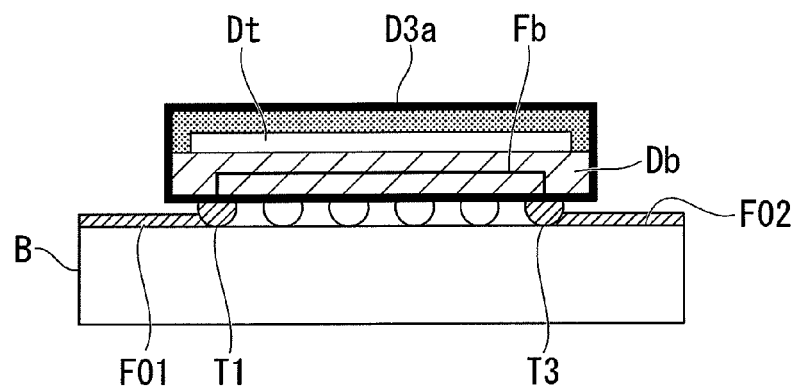
FIG. 9 is a cross-sectional view illustrating a semiconductor device according to a third embodiment of the present invention.
Figure 10:
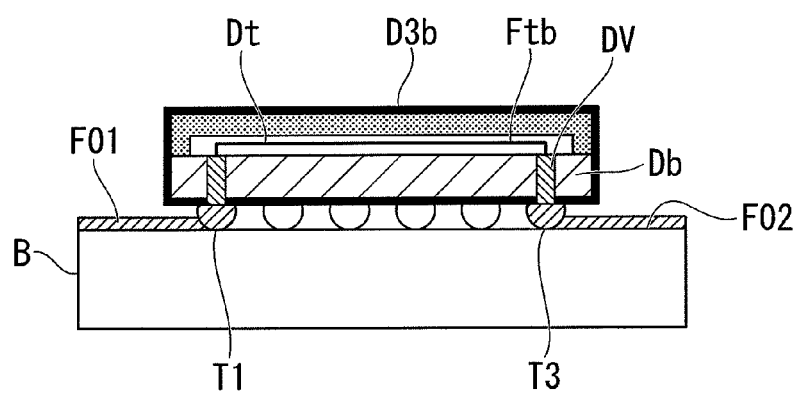
FIG. 10 is a cross-sectional view illustrating a semiconductor device according to a modification of the third embodiment.
Figure 11:
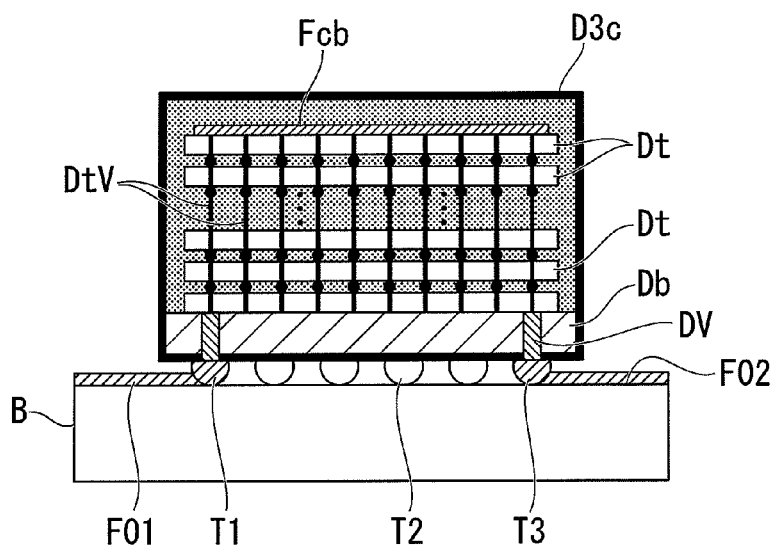
FIG. 11 is a cross-sectional view illustrating a semiconductor device according to another modification of the third embodiment.

FIGS. 9 to 11 are cross-sectional views illustrating examples of the conductive path extending in the semiconductor package so as to connect the balls T1 and T3 on the rear surface of the semiconductor package. Illustrations of the other wires W are omitted in FIGS. 9 to 11.

In the case of FIG. 9, a semiconductor package D3a includes: a package board Db; a semiconductor chip Dt, such as an LSI, on the upper surface of the package board Db; balls T on the rear surface of the semiconductor package D3a; and a conductive path Fb extending in the package board Db. The conductive path Fb electrically connects the balls T1 and T3.

In the case of FIG. 10, a semiconductor package D3b includes: the package board Db; the semiconductor chip Dt on the upper surface of the package board Db; balls T on the rear surface of the semiconductor package D3b; conductive electrodes DV penetrating through the wiring board Db: and a conductive path Ftb extending in the semiconductor chip Dt. The conductive electrodes DV are connected to the balls T1 and T3. The conductive path Ftb shorts the conductive electrodes DV and thus electrically connects the balls T1 and T3.

In the case of FIG. 11, a semiconductor package D3c includes: the package board Db; multiple semiconductor chips Dt stacked on the package board Db; the conductive electrodes DV penetrating through the wiring board Db; balls T on the rear surface of the semiconductor package D3c; conductive electrodes DtV penetrating through the stack of the semiconductor chips Dt; and a conductive wire (path) Fcb extending on the top semiconductor chip Dt. The conductive electrodes DV are connected to the balls T1 and T3. The conductive wire Fcb electrically connects the balls T1 and T3 through the conductive electrodes DV and DtV.

Figure 12:
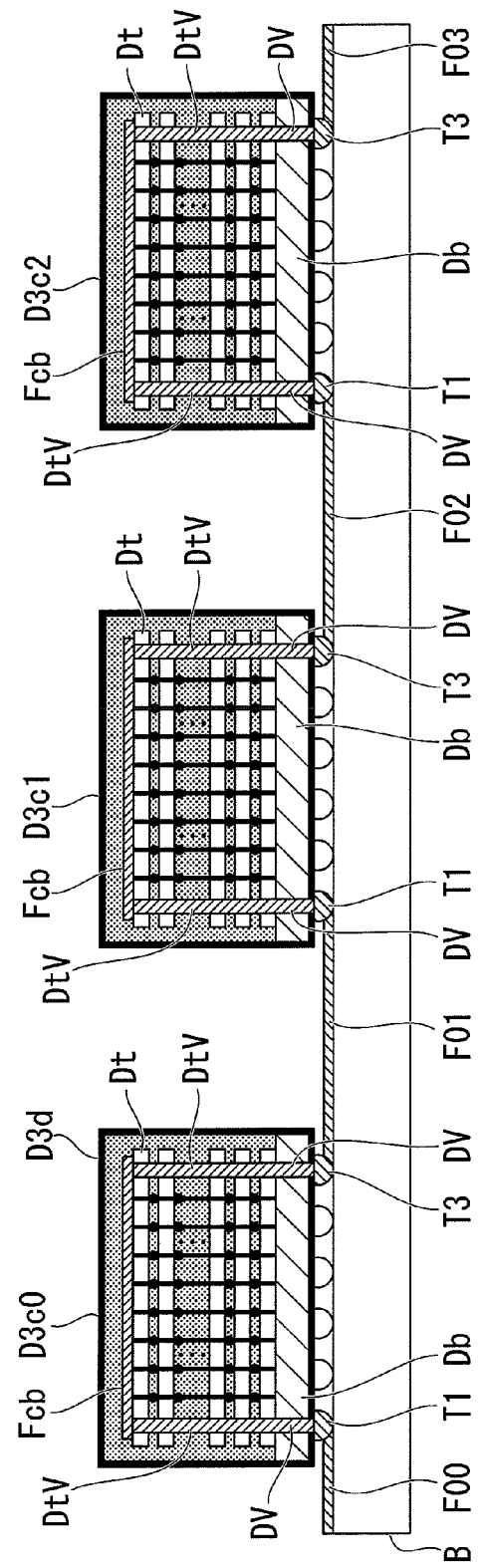
FIG. 12 is a cross-sectional view illustrating a signal path structure of a semiconductor device including multiple semiconductor packages each having the same structure as of shown in FIG. 11.

FIG. 12 is a cross-sectional view illustrating connection of the fly-by wire F to the balls T when multiple semiconductor packages D3c shown in FIG. 11 are provided on the wiring board B. In this case, a fly-by signal output from the input terminal Fa shown in FIGS. 16 to 18 is transferred to the ball T1 of the memory D3c0 through the fly-by wire F00 extending on the upper surface of the wiring board B. Then, the fly-by signal is transferred from the ball T1 of the memory D3c0 to the ball T3 of the memory D3c0 through the left conductive electrodes DV and DtV, the conductive wire (path) Fcb, and the right conductive electrodes DtV and DV.

Then, the fly-by signal is transferred from the ball T3 of the memory D3c0 to the ball T1 of the memory D3c1 through the fly-by wire F01 extending on the upper surface of the wiring board B. Then, the fly-by signal is transferred from the ball T1 of the memory D3c1 to the ball T3 of the memory D3c1 through the left conductive electrodes DV and DtV, the conductive path Fcb, and the right conductive electrodes DtV and DV.

Then, the fly-by signal is transferred from the ball T3 of the memory D3c1 to the ball T1 of the memory D3c2 through the fly-by wire F02 extending on the upper surface of the wiring board B. Then, the fly-by signal is transferred from the ball T1 of the memory D3c2 to the ball T3 of the memory D3c2 through the left conductive electrodes DV and DtV, the conductive wire (path) Fcb, and the right conductive electrodes DtV and DV. Thus, the fly-by wire F achieves the stubless (non-branching) fly-by topology.

To achieve the stubless fly-by topology, it is necessary to provide the fly-by wire Fcb on the top semiconductor chip Dt and to use the entire conducive electrodes DV and DtV in the depth direction.

Figure 13:
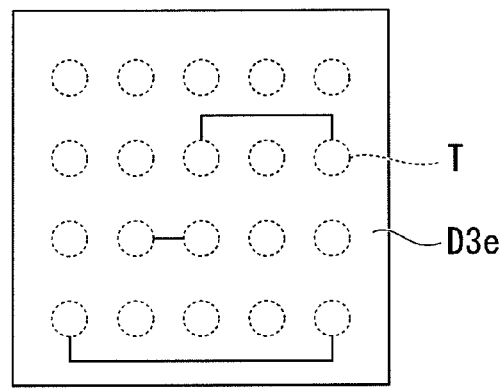
FIG. 13 is a plan view illustrating a signal path structure of a semiconductor device according to another modification of the third embodiment.
Figure 14:
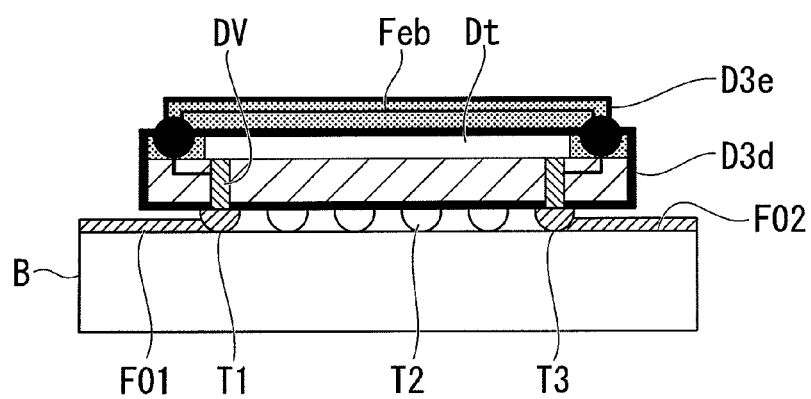
FIG. 14 is a cross-sectional view illustrating the semiconductor device shown in FIG. 13.

As a modification of the third embodiment, another package D3e may be provided on the package D3d, as shown in FIGS. 13 and 14. FIG. 13 is a plan view illustrating arrangement of balls on the rear surface of the additional package D3e, and connection of the balls to the conductive paths. FIG. 14 is a cross-sectional view illustrating the additional package D3e shown in FIG. 13 that is stacked on the package D3d.

In the case of FIGS. 13 and 14, the package D3e is stacked on the package D3d so as to electrically connect the balls T1 and T3. In this case, the entire conductive electrodes DV in the depth direction are used. The wires Feb extend in the package D3e without branching. Thereby, the stubless fly-by structure can be achieved without greatly changing the circuit structure in the package D3d.

Figure 15:
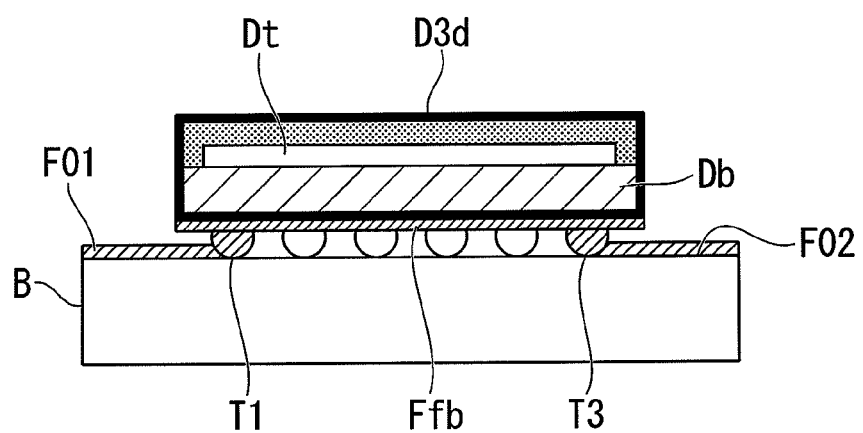
FIG. 15 is a plan view illustrating a semiconductor device according to another modification of the third embodiment.

FIG. 15 is a cross-sectional view illustrating a shorting circuit Ftb on the rear surface of the package D3d. The circuit Ftb shorts, as a conductive path, at least one pair of terminals T1 and T3 on the rear surface of the semiconductor package, which are not electrically connected to the elements in the semiconductor package D3d. In this case, the pitch of the balls arranged between the balls T1 and T3 may be increased so that the balls T1 and T3 can be connected stublessly.

In the third embodiment, with respect to a fly-by signal transferred from the wiring board to the semiconductor package, an input terminal (ball) and an output terminal (ball) which are disposed on the rear surface of the semiconductor package (chip) are paired. The one pair of balls are connected by one non-branching wire that does not extend in internal wiring layers of a multi-layered board, but in a package board and the like provided between the semiconductor chip and the balls. In other words, the fly-by signal can be transferred in the semiconductor package from the input terminal (ball) to the output terminal (ball) without any stub or with so short stub length as not to affect the signal waveforms. Accordingly, the effect of stub can be reduced compared to when wires extending in a substrate, such as a motherboard, is used.

In other words, one pair of the balls T1 and T3 on the rear surface of the semiconductor package D3 are shorted by a conductive path provided inside or outside the package D3. When the fly-by signal reaches the ball T1 on the rear surface of the semiconductor package, the fly-by signal is transferred through a given signal path provided inside or outside the package D3. Then, the fly-by signal reaching the ball T3 is transferred to the fly-by wire F extending on the wiring board B without any stub. Then, the fly-by wire F extending on the wiring board B is connected to the ball T1 of an adjacent semiconductor package. Thus, the stubless fly-by topology can be achieved. Accordingly, provision of wires connecting balls in a package mounting region, and complicated wire routing can be prevented, thereby enabling easy connection of the wiring board and the balls on the semiconductor package, and therefore achieving a similar effect as explained in the above embodiments.

Fourth Embodiment

Hereinafter, a fourth embodiment of the present invention is explained. Like reference numerals denote like elements between the first and fourth embodiments.

As shown in FIGS. 19 to 23, a semiconductor device 40 of the fourth embodiment has a structure in which each of multiple portions F30, F31, F32, and the like, into which the fly-by wire F is divided, is further divided and connected to wires in a different layer without branching, thereby achieving the stubless structure.

Figure 19:
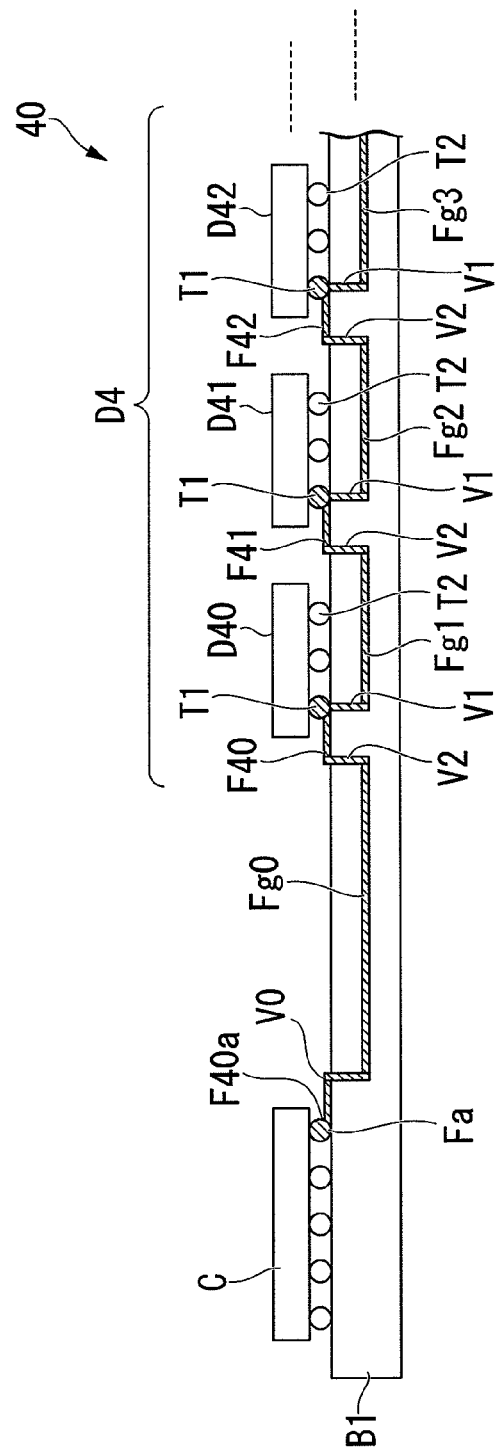
FIG. 19 is a cross-sectional view illustrating a signal path structure of a semiconductor device according to a fourth embodiment of the present invention.
Figure 20:
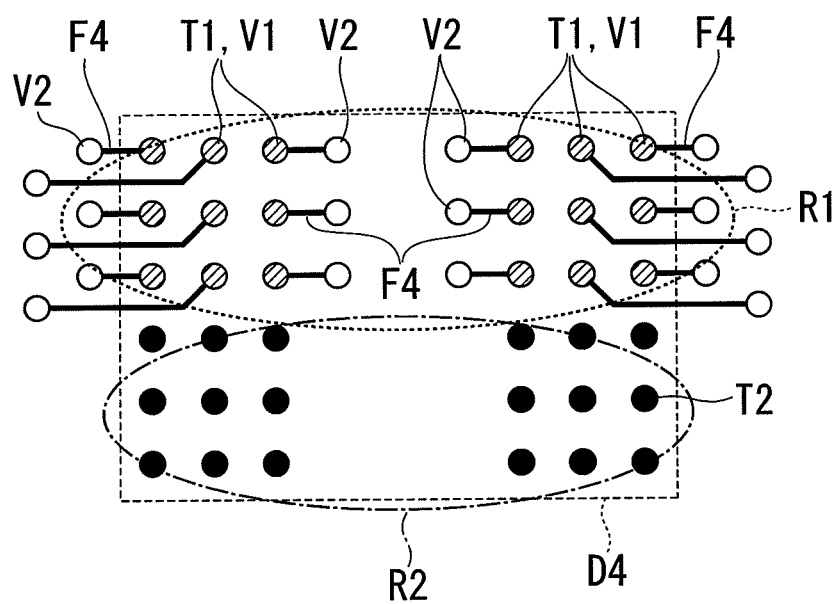
FIG. 20 is a plan view illustrating the signal path structure of the semiconductor device of the fourth embodiment.
Figure 21:
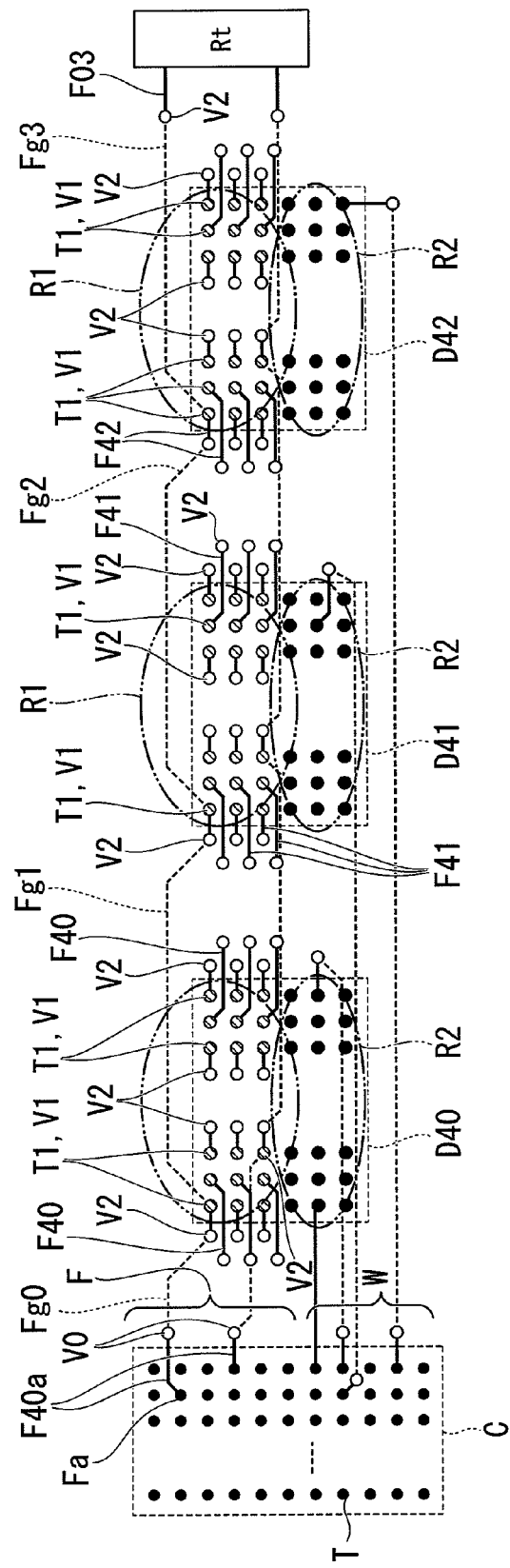
FIG. 21 is a perspective plan view illustrating the signal path structure of the semiconductor device of the fourth embodiment.

FIG. 19 is a cross-sectional view illustrating the semiconductor device 40 in which the fly-by wires are stublessly connected using internal wires. FIG. 20 is a plan view illustrating arrangement of terminals on a rear surface of a semiconductor package and connection of the terminals to wires extending on an upper surface of the wiring board. Specifically, FIG. 20 illustrates the fly-by region R1, the other signal region R2 adjacent to the fly-by region R1, and connection of the fly-by wires in an internal layer to vias V. FIG. 21 is a plan view illustrating a wiring structure and connection of wires extending on the upper surface of the wiring board, wires extending in internal layers, and vias extending in the depth direction. FIG. 21 further illustrates arrangement and connection of balls on the rear surface of the semiconductor package.

In the case of FIG. 19, the semiconductor device 40 includes: a wiring board B1; semiconductor packages 40 including multiple memories D40, D41, and D42 which are arranged in a horizontal line on the wiring board B1; a memory controller C on the upper surface of the wiring board B1; non-branching fly-by wires extending from the input terminal Fa of the memory controller C to the termination resistor Rt on the wiring board B1. The fly-by wires include: fly-by wires F40, F41, and F42 extending on the upper surface of the wiring board B1; internal fly-by wires Fg0, Fg1, Fg2, and Fg3 extending on an internal layer; vias V connecting the fly-by wires F40, F41, and F42 to the internal fly-by wires Fg0, Fg1, and Fg3, respectively. Thus, non-branching fly-by wires (signal paths) are formed.

Specifically, one end F40a of the fly-by wire F40 is connected to the input terminal Fa. The other end of the fly-by wire F40 is connected to one end of the internal fly-by wire Fg0 through the via V0. The other end of the fly-by wire Fg0 is connected to one end of the fly-by wire F40 through the via V2. The other end of the fly-by wire F40 is connected to the ball T1 of the memory D40. The other end of the fly-by wire F40 and the ball (pad-on-via) T1 are connected to one end of the internal fly-by wire Fg1 through the via V1.

The other end of the internal fly-by wire Fg1 is connected to one end of the fly-by wire F41 through the via V2. The other end of the fly-by wire F41 is connected to the ball T1 of the memory D41. The other end of the fly-by wire F41 and the ball (pad-on-via) T1 are connected to one end of the internal fly-by wire Fg2 through the via V1.

The other end of the internal fly-by wire Fg2 is connected to one end of the fly-by wire F42 through the via V2. The other end of the fly-by wire F42 is connected to the ball T1 of the memory D42. The other end of the fly-by wire F42 and the ball (pad-on-via) T1 are connected to one end of the internal fly-by wire Fg3 through the via V1. Similar structure applies to the memory D43 and the like.

The internal fly-by wires Fg0, Fg1, Fg2, and Fg3 are provided on the same internal layer in the wiring board B1, as shown in FIG. 19. Multiple balls T on the rear surface of each of the memories D40, D41, and D42 includes: a ball (first terminal) T1 connected to the fly-by wire F4; a ball (second terminal) T2 connected to another wire (not shown) through the via V; and a support ball (not shown) for fixing the semiconductor package onto the wiring board B, which is not connected to signal wires.

As shown in FIG. 20, the rear surface of each of the memories D40, D41, and D42 has: the fly-by region R1 that is the upper part of the rear surface; and the other signal region R2 that is the lower part of the rear surface. The balls (terminals) T1 are provided in the fly-by region R1. The balls (terminals) T2 are provided in the other signal region R2. As shown in FIG. 21, in each of the memories D40, D41, and D42, the arrangement direction of the fly-by region R1 and the other signal region R2 is perpendicular to the arrangement direction of the memories D40, D41, and D42.

In the fly-by region R1, the vias V1 are arranged in the wiring board B1 at substantially the same pitch as of the balls T1, as shown in FIG. 20. The top portion of each of the vias V1 and V2 is connected to the fly-by wire F4 extending on the upper surface of the wiring board B1. The bottom portion of each of the vias V1 and V2 is connected to the internal fly-by wire Fg extending on an internal layer of the wiring board B1.

Thus, according to the semiconductor package D4 of the fourth embodiment, at least one ball T1 corresponding to the fly-by wire F may be provided on the rear surface of the semiconductor package D4, similarly to the semiconductor packages D1 and D2 of the first and second embodiments, respectively.

Figure 22:
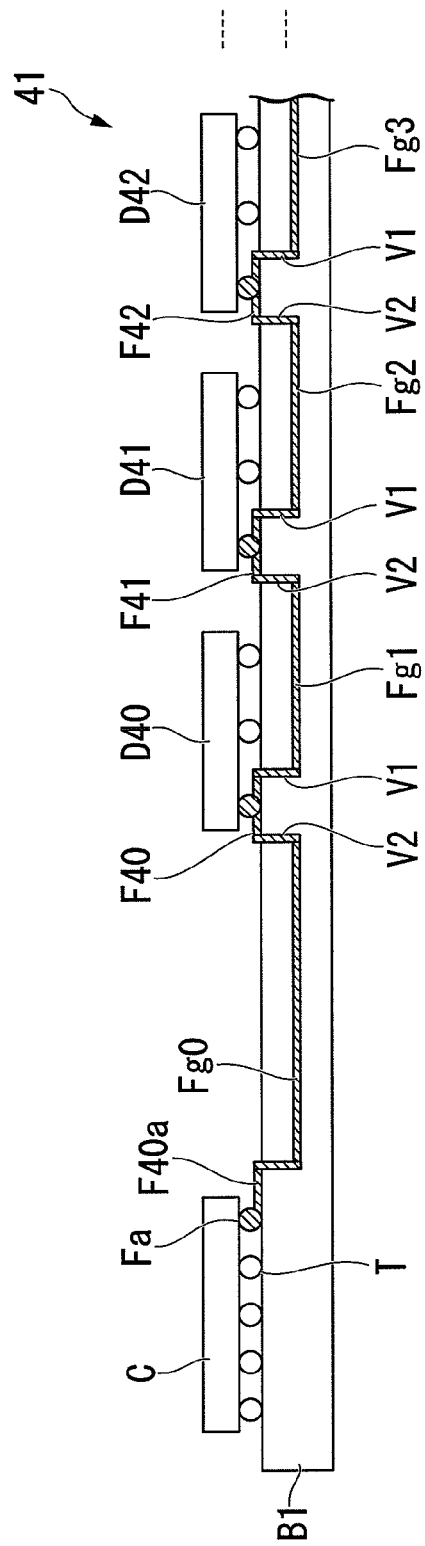
FIG. 22 is a cross-sectional view illustrating a signal path structure of a semiconductor device according to a modification of the fourth embodiment.

FIG. 22 is a cross-sectional view illustrating a modification of the fourth embodiment. In the case of FIG. 22, the terminal T1 is not used as the pad-on-via. Instead, two vias V1 and V2 are provided separately. The via V1 connects the internal fly-by wire Fg to the fly-by wire F4. The via V2 connects the fly-by wire F4 to another internal fly-by wire Fg. In this case, the end portions of the fly-by wire F4 are connected to the top portions of the two internal fly-by wires Fg. Additionally, the fly-by wire F4 is connected to the ball T1 in the middle portion of the fly-by wire F4 between the vias V1 and V2.

According to the modification of the fourth embodiment shown in FIG. 22, the fly-by wire (signal path) F is connected to the two internal fly-by wires Fg through the vias V1 and V2, and thus the stubless structure is achieved, thereby increasing the freedom of arrangement of packages and fly-by wires without changing the pitch of the balls.

Figure 23:
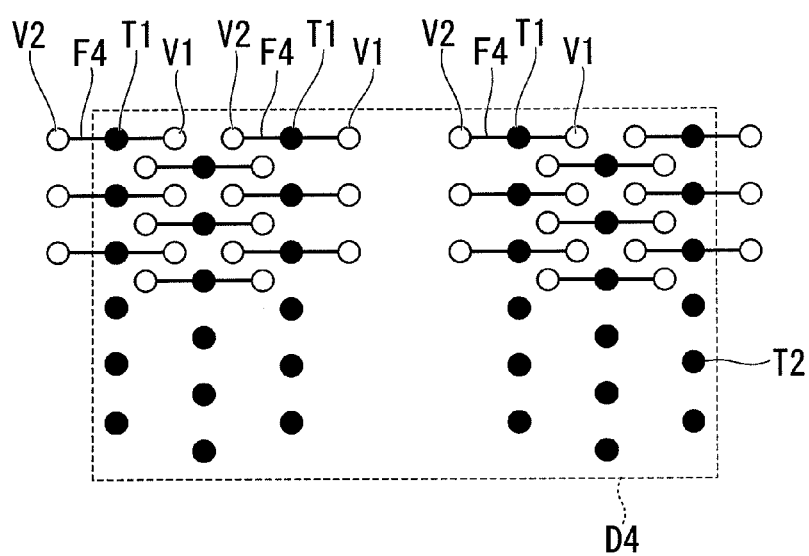
FIG. 23 is a plan view illustrating the signal path structure of the semiconductor device of the modification of the fourth embodiment.

FIG. 23 is a plan view illustrating arrangement of balls on the rear surface of the semiconductor package and connection of the balls to wires extending on the upper surface of the wiring board. The via V1, which is connected to the one end of the internal fly-by wire Fg, is provided separately from the ball T1. Every other row or column of the balls T is shifted by the half pitch. As a matter of course, other arrangement of balls may be used.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention as long as a fly-by topology as one non-branching wire is achieved.

In addition, while not specifically claimed in the claim section, the application reserves the right to include in the claim section at any appropriate time the following device and method.

What is claimed is:

1. An apparatus comprising:
a wiring substrate including an insulating body having a first main surface and a second main surface opposite to the first main surface, the wiring substrate further including a plurality of first wiring layers each formed on the first main surface of the insulating body, each of the first wiring layers including a first terminal, a second terminal, a first line connecting the first and second terminals to each other, a third terminal being on a side opposite to the first terminal with respect to the second terminal and a second line connecting the second and third terminals to each other, and the first, second and third terminals and the first and second lines being formed continuously with one another in direct contact with the first main surface of the insulating body;
a control device including a plurality of fourth terminals, the control device being mounted over the wiring substrate on a side of the first main surface of the insulating body with each of the fourth terminals being connected to the first terminal of an associated one of the first wiring layers;
a first memory device including a plurality of fifth terminals, the first memory device being mounted over the wiring substrate on a side of the first main surface of the insulating body with each of the fifth terminals being connected to the second terminal of an associated one of the first wiring layers; and
a second memory device including a plurality of sixth terminals, the second memory device being mounted over the wiring substrate on a side of the first main surface of the insulating body with each of the sixth terminals being connected to the third terminal of an associated one of the first wiring layers.

2. The apparatus as claimed in claim 1, wherein the first and second lines of each of the first wiring layers are free from a branching portion.

3. The apparatus as claimed in claim 1, wherein each of the first wiring layers transfers at least one of a clock signal, an address signal, and a command signal.

4. The apparatus as claimed in claim 1, wherein each of the first wiring layers is formed based on a fly-by topology.

5. The apparatus as claimed in claim 1, wherein the wiring substrate further includes a plurality of second wiring layers and a plurality of third wiring layers, each of the second wiring layers having a seventh terminal, an eighth terminal and a third line connecting the seventh and eighth terminals to each other, each of the third wiring layers having a ninth terminal, a tenth terminal and a fourth line connecting the ninth and tenth terminals to each other, the control device further includes a plurality of eleventh terminals and a plurality of twelfth terminals, each of the eleventh terminals is connected to the seventh terminal of an associated one of the second wiring layers and, each of the twelfth terminals is connected to the ninth terminal of an associated one of the third wiring layers, the first memory device farther includes a plurality of thirteenth terminals each coupled to the eighth terminal of an associated one of the second wiring layers, and the second memory device further includes a plurality of fourteenth terminals each coupled to the tenth terminal of an associated one of the third wiring layers.

6. The apparatus as claimed in 5, wherein the first memory device further comprises a first surface facing to the first main surface of the insulating body and including first and second regions, all of the fifth terminals are formed on the first region of the first surface, all of the thirteenth terminals are formed on the second region of the first surface.

7. The apparatus as claimed in claim 6, wherein none of the thirteenth terminals is formed on the first region of the first surface and none of the fifth terminals is formed on the second region of the first surface.

8. The apparatus as claimed in claim 6, wherein the fifth terminals are arranged at a first pitch in the first region of the first surface, the thirteenth terminals are arranged at a second pitch in the second region of the first surface, the first and second regions are apart from each other by a distance that is greater than the first and second pitches.

9. The apparatus as claimed in claim 8, wherein the first and second memory devices are arranged in a first direction over the first main surface of the insulating body and the first and second regions of the first surface of the first memory device are arranged in the first direction.

10. The apparatus as claimed in claim 6, wherein the fifth terminals are arranged at a first pitch in the first region of the first surface, the thirteenth terminals are arranged at a second pitch in the second region of the first surface, the first pitch is greater than the second pitches.

11. The apparatus as claimed in claim 10, wherein the first and second memory devices are arranged in a first direction over the first main surface of the insulating body and the first and second regions of the first surface of the first memory device are arranged in a second direction that is crosses the first direction.

12. The apparatus as claimed in claim 1, wherein the control device further includes a plurality of third terminals formed on the first surface and a plurality of fourth terminals formed on the first surface, and each of the first and second memory devices further includes a plurality of fifth terminals formed on the second surface, and the wiring substrate further comprises,
 a plurality of second wiring layers each including a fourth portion that is in contact with an associated one of the third terminals of the control device, a fifth portion that is in contact with an associated one of the fifth terminals of the first memory device and a third line connecting the fourth and fifth portions to each other, and
 a plurality of third wiring layers each including a sixth portion that is in contact with an associated one of the fourth terminals of the control device, a seventh portion that is in contact with an associated one of the fifth terminals of the second memory device and a fourth line connecting the sixth and seventh portions to each other.

13. The apparatus as claimed in 12, wherein the second surface of the first memory device includes first and second regions, all of the second terminals of the first memory device are formed on the first region of the first surface, all of the fifth terminals of the first memory device are formed on the second region of the first surface.

14. The apparatus as claimed in claim 13, wherein none of the fifth terminals of the first memory device is formed on the first region of the first surface and none of the second terminals of the first memory device is formed on the second region of the first surface.

15. The apparatus as claimed in claim 13, wherein the second terminals of the first memory device are arranged at a first pitch in the first region of the first surface, the fifth terminals of the first memory device are arranged at a second pitch in the second region of the first surface, the first and second regions are apart from each other by a distance that is greater than the first and second pitches.

16. The apparatus as claimed in claim 15, wherein the first and second memory devices are arranged in a first direction over the first main surface of the wiring substrate and the first and second regions of the first surface of the first surface memory device are arranged in the first direction.

17. An apparatus comprising,
 a wiring substrate including a first main surface and a second main surface opposite to the first main surface;
 a control device mounted over the first main surface of the wiring substrate and including a first surface facing the first main surface of the wiring substrate and a plurality of first terminals formed on the first surface; and
 first and second memory devices mounted over the first surface of the wiring board, each of the first and second memory devices comprising a second surface facing the first main surface of the wiring substrate and a plurality of second terminals formed on the second surface;
 wherein the wiring substrate further includes a plurality of first wiring layers each including a first portion that is in contact with an associated one of the first terminals of the control device, a second portion that is in contact with an associated one of the second terminals of the first memory device, a first line connecting the first and second portions, a third portion that is in contact with an associated one of the second terminals of the second memory device and is on a side opposite to the first portion with respect to the second portion, and a second line connecting the second and third portions, the first, second and third portions and the first and second lines of
 each of the first wiring layers is located continuously one another on the first main surface of the wiring substrate, and each of the first and second lines of each of the first wiring layers are free from passing through an inside of the first memory device.

18. The apparatus as claimed in claim 17, wherein the first and second lines of each of the first wiring layers are free from a branching portion.

19. The apparatus as claimed in claim 17, wherein each of the first wiring layers transfers at least one of a clock signal, an address signal, and a command signal.

20. The apparatus as claimed in claim 17, wherein each of the first wiring layers is formed based on a fly-by topology.

* * * * *